United States Patent
Rizzo et al.

(10) Patent No.: US 11,502,388 B2
(45) Date of Patent: Nov. 15, 2022

(54) ELECTRONIC DEVICE INCLUDING AN ANTENNA

(71) Applicant: STMicroelectronics, Inc., Coppell, TX (US)

(72) Inventors: Pierre Rizzo, Mountain View, CA (US); John Coronado, Soquel, CA (US); Mohammad Mazooji, San Jose, CA (US)

(73) Assignee: STMICROELECTRONICS, INC., Coppell, TX (US)

(*) Notice: Subject to any disclaimer, the term of this patent is extended or adjusted under 35 U.S.C. 154(b) by 280 days.

(21) Appl. No.: 16/252,985

(22) Filed: Jan. 21, 2019

(65) Prior Publication Data

US 2019/0229397 A1    Jul. 25, 2019

Related U.S. Application Data

(60) Provisional application No. 62/620,123, filed on Jan. 22, 2018.

(51) Int. Cl.
| | |
|---|---|
| *H01Q 1/22* | (2006.01) |
| *H01Q 1/52* | (2006.01) |
| *H01Q 1/42* | (2006.01) |
| *H01Q 1/24* | (2006.01) |
| *H01Q 1/27* | (2006.01) |
| *H01Q 1/48* | (2006.01) |
| *H05K 1/02* | (2006.01) |
| *H05K 7/14* | (2006.01) |
| *H05K 9/00* | (2006.01) |

(Continued)

(52) U.S. Cl.
CPC .......... *H01Q 1/2266* (2013.01); *G04G 17/04* (2013.01); *G04G 21/04* (2013.01); *G04R 60/12* (2013.01); *H01Q 1/243* (2013.01); *H01Q 1/273* (2013.01); *H01Q 1/42* (2013.01); *H01Q 1/48* (2013.01); *H01Q 1/526* (2013.01); *H01Q 7/00* (2013.01); *H05K 1/0216* (2013.01); *H05K 1/181* (2013.01); *H05K 7/1427* (2013.01); *H05K 9/0022* (2013.01); *H05K 2201/10098* (2013.01)

(58) Field of Classification Search
CPC ........ G04G 17/04; G04G 21/04; G04R 60/12; H01Q 1/2266; H01Q 1/243; H01Q 1/273; H01Q 1/42; H01Q 1/48; H01Q 1/526; H01Q 7/00; H05K 1/0216; H05K 1/181; H05K 2201/10098; H05K 7/1427; H05K 9/0022

USPC ........................................................ 343/702

See application file for complete search history.

(56) References Cited

U.S. PATENT DOCUMENTS

| | | | |
|---|---|---|---|
| 10,164,439 B2 * | 12/2018 | Jeong | ........................ H01Q 7/00 |
| 2013/0050046 A1 * | 2/2013 | Jarvis | ...................... H01Q 9/145 |
| | | | 343/852 |

(Continued)

*Primary Examiner* — Alexander H Taningco
*Assistant Examiner* — Amy X Yang
(74) *Attorney, Agent, or Firm* — Slater Matsil, LLP

(57) ABSTRACT

An embodiment electronic device includes a ground plane; and an antenna. The antenna includes a first trace having a first end and a second end, the second end of the first trace being electrically coupled to the ground plane. The antenna also includes a second trace distinct and physically separated from the first trace, the second trace having a first end and a second end, the second end of the second trace being electrically coupled to the ground plane, the first trace and the second trace forming discontinuous portions of the antenna.

19 Claims, 11 Drawing Sheets

(51) Int. Cl.
*H05K 1/18* (2006.01)
*G04G 21/04* (2013.01)
*G04G 17/04* (2006.01)
*H01Q 7/00* (2006.01)
*G04R 60/12* (2013.01)

(56) References Cited

U.S. PATENT DOCUMENTS

| | | | |
|---|---|---|---|
| 2016/0181696 A1 | 6/2016 | Rizzo | |
| 2016/0315373 A1* | 10/2016 | Azad | H01Q 1/48 |
| 2016/0380337 A1* | 12/2016 | Lee | H04B 5/0031 |
| | | | 343/702 |
| 2017/0048649 A1* | 2/2017 | Olgun | H01Q 7/00 |

* cited by examiner

ELECTRONIC DEVICE INCLUDING AN ANTENNA

CROSS-REFERENCE TO RELATED APPLICATIONS

This application claims the benefit of U.S. Provisional Application No. 62/620,123, filed on Jan. 22, 2018, which application is hereby incorporated herein by reference.

TECHNICAL FIELD

The present disclosure relates generally to an electronic device including an antenna and in particular embodiments to a structure of the antenna of the electronic device.

BACKGROUND

An aspect of the electronic device market that has focused on the miniaturization of electronic devices, such as smartphones and tablet PCs, has recently expanded to the wearable device market for increasing the portability of electronic devices for the user. Since wearable devices, such as eyeglasses, watches, and clothes, can be worn on the body of the user, wearable devices are able to provide functions of existing smart electronic devices, such as a data communication function, while being more portable than other existing smart devices. Therefore, wearable devices can provide various convenient functions.

The compact electronic device may include various antennas that support a variety of communication functions for the electronic device, for example, a voice call function or a data communication function. However, antennas of the electronic device are limited due to shapes, sizes, and materials thereof. Furthermore, when different frequency bands are used in different applications to perform certain functions, a single electronic device may include a plurality of various antennas and/or antenna patterns. However, due to limits resulting from restrictions on the outer size and shape of the electronic device (e.g., the size and shape of a smartwatch), it may be difficult to include antennas and antenna patterns for different functions in the compact electronic device.

SUMMARY

An embodiment electronic device includes a ground plane; and an antenna. The antenna includes a first trace having a first end and a second end, the second end of the first trace being electrically coupled to the ground plane. The antenna also includes a second trace distinct and physically separated from the first trace, the second trace having a first end and a second end, the second end of the second trace being electrically coupled to the ground plane, the first trace and the second trace forming discontinuous portions of the antenna.

An embodiment electronic device includes a discontinuous single-turn antenna. The discontinuous single-turn antenna includes a first conductive trace having a first end and a second end; and a second conductive trace physically separated from the first conductive trace, the second conductive trace having a first end and a second end, where the first end of the first conductive trace and the first end of the second conductive trace include driving nodes of the discontinuous single-turn antenna. The electronic device further includes a ground plane electrically coupled to the second end of the first conductive trace and the second end of the second conductive trace, the ground plane being configured to provide electrical continuity between the first conductive trace and the second conductive trace.

An embodiment electronic device includes a metal shielding configured to shield internal circuitry of the electronic device from radiofrequency (RF) interference; a circuit board having a major surface; and an antenna. The antenna includes a first conductive line disposed on the major surface of the circuit board, the first conductive line having a first end and a second end, the first end of the first conductive line being configured to be a first RF input of the antenna. The antenna further includes a second conductive line disposed on the major surface of the circuit board, the second conductive line being physically separated from the first conductive line, the second conductive line having a first end and a second end, the first end of the second conductive line being configured to be a second RF input of the antenna, where electrical continuity between the first conductive line and the second conductive line is mediated through the metal shielding.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Obstruction zones and the cramped real estate within a body of an electronic device may reduce the amount of room available for an NFC antenna within the electronic device. The NFC antenna may be used for radio communication or wireless power transfer for the electronic device. This reduction in the amount of room available may prevent the use of a classical multi-turn inductive coil antenna or a continuous single-turn inductive coil antenna for the NFC antenna. According to various embodiments disclosed herein, the NFC antenna is realized by a discontinuous antenna (e.g. discontinuous single-turn antenna) having a first trace and a second trace physically separated from the first trace and where electrical continuity between the first trace and the second trace is mediated through an intermediary structure, which can be a ground plane, the underside, or the body of the electronic device. Since a size of the NFC antenna formed by the first trace, the second trace, and the intermediary structure is not limited by the obstruction zones and cramped real estate within the body of the electronic device, the NFC antenna formed by the embodiments disclosed herein have high RF efficiency compared to NFC antennas that are made to confirm to the reduced amount of room available in the body of the electronic device. Furthermore, the embodiments disclosed herein allow the NFC antenna inserted into the body of the electronic device to be compatible with the ground plane, underside, or body of the electronic device, thereby avoiding the need for an opening in these portions of the electronic device to ensure proper functioning of the NFC antenna.

Figure 1A:
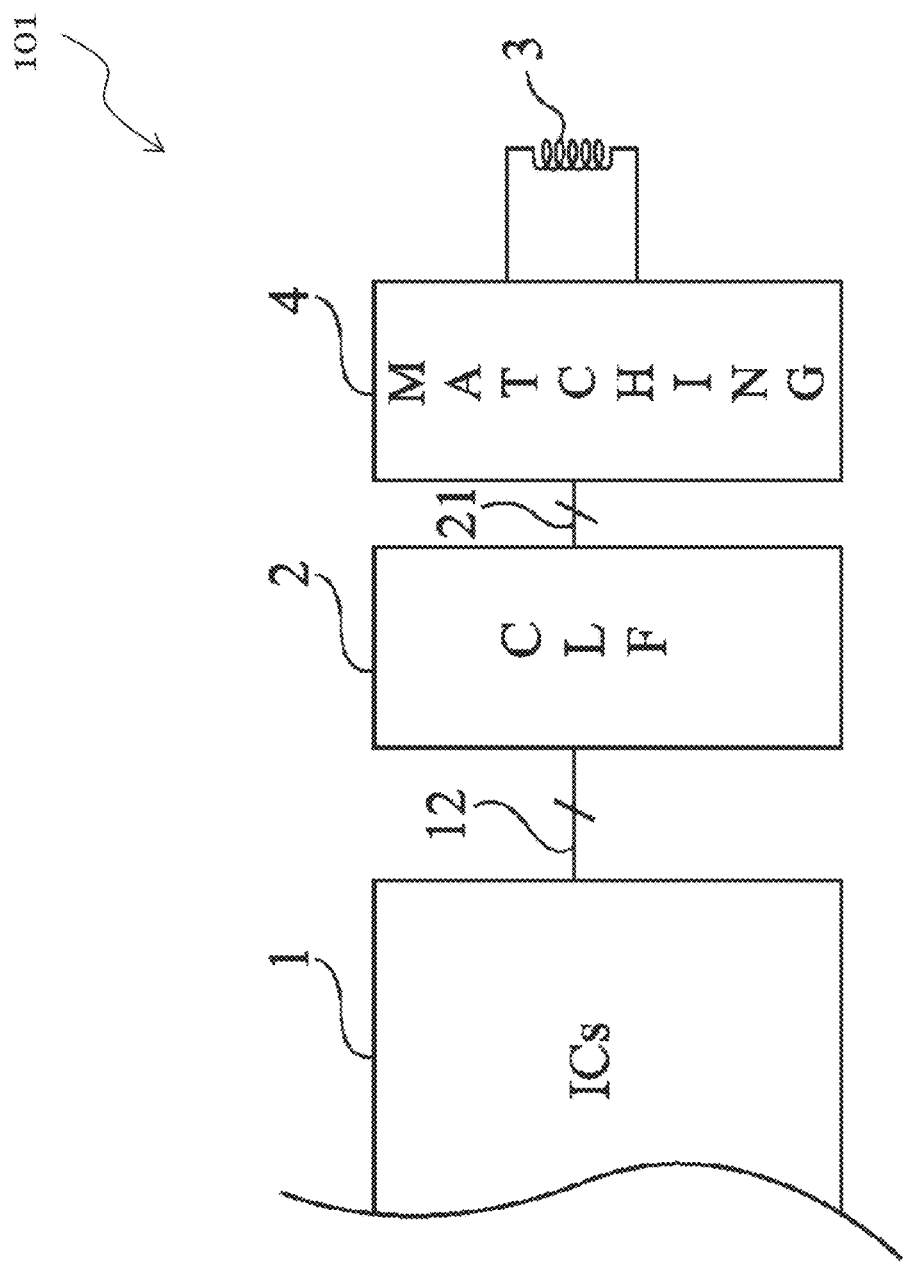
FIG. 1A shows a block diagram illustrating circuit architecture of an electronic device, in accordance with an embodiment.

FIG. 1A shows a block diagram illustrating circuit architecture of an electronic device 101, in accordance with an embodiment. The electronic device 101 includes electronic circuits 1 (ICs) capable of exchanging signals (connection 12) with a contactless front end 2 (CLF) forming an interface between circuits 1 and an antenna 3. A matching network 4, forming a frequency tuning and impedance matching circuit, is interposed between radio frequency inputs-outputs 21 of the front end 2 and the antenna 3. The antenna 3 is generally formed of conductive winding.

Figure 1B:
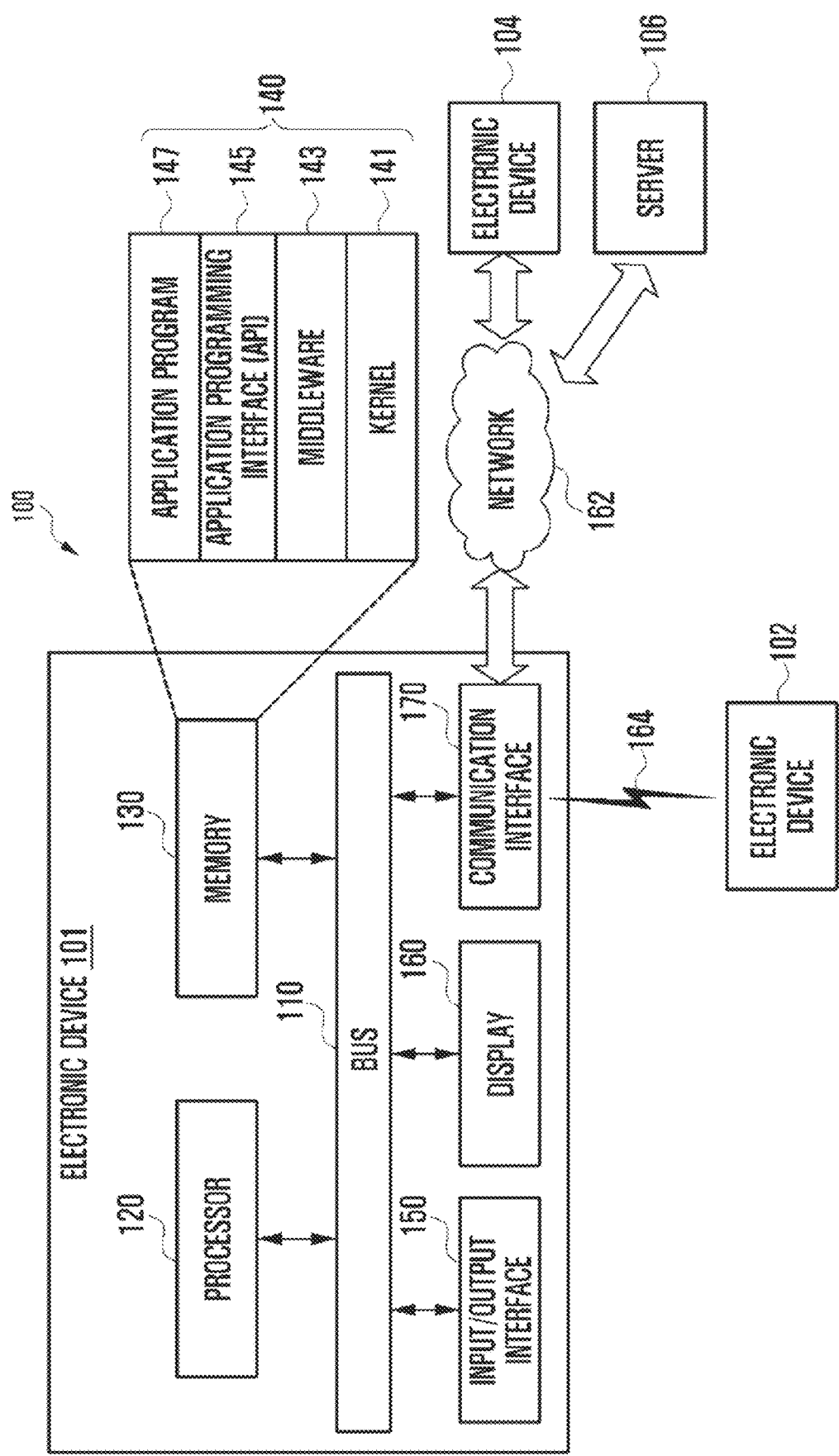
FIG. 1B illustrates a network environment including an electronic device communicatively coupled to external electronic devices in accordance with an embodiment.

FIG. 1B illustrates a network environment 100 including the electronic device 101 communicatively coupled to external electronic devices 102, 104, in accordance with an embodiment. The electronic device 101 may be a device having a communication function. For example, the electronic device 101 may be a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), an MP3 player, a mobile medical appliance, a camera, and/or a wearable device. In embodiment where the electronic device 101 is a wearable device, the electronic device 101 may be a head-mounted-device (HMD), electronic glasses, electronic clothes, an electronic bracelet, an electronic necklace, an electronic accessory, electronic tattoos, or a smartwatch. In other embodiments, the electronic device 101 may be a smart home appliance with a communication function, for example, a smart television, a digital video disk (DVD) player, a refrigerator, an air conditioner, a vacuum cleaner, an oven, a microwave oven, a washing machine, an air cleaner, a set-top box, a television (TV) box (e.g., Samsung HomeSync™, Apple TV™, or Google TV™), a game console, an electronic dictionary, an electronic key, a camcorder, and/or an electronic photo frame.

In the example of FIG. 1B, the electronic device 101 includes a bus 110, a processor 120, a memory 130, an input/output interface 150, a display 160, and a communication interface 170. The bus 110 may be a circuit interconnecting the aforementioned components of the electronic device 101 and transmitting communication signals (e.g., a control message) between the aforementioned components of the electronic device 101.

The processor 120, for example, may receive instructions from the memory 130, the input/output interface 150, the display 160, and/or the communication interface 170. The processor 120 may decode the received instructions and perform operations or data processing according to the decoded instructions. The memory 130 may store instructions or data received from or generated by the processor 120 or other components, such as the input/output interface 150, the display 160, and the communication interface 170. The memory 130 includes a programming module 140 including, for example, a kernel 141, middleware 143, an application programming interface (API) 145, and an application 147. The programming module 140 may be formed by software, firmware, hardware, or a combination thereof.

The kernel 141 may control or manage system resources (e.g., the bus 110, the processor 120, and the memory 130) that are used to execute operations or functions implemented in the middleware 143, the API 145, and the application 147. Further, the kernel 141 may provide an interface that allows the middleware 143, the API 145, or the application 147 to access and control or manage individual components of the electronic device 101.

The middleware 143 may serve to mediate between the API 145 or the applications 147 and the kernel 141, that is, allow the API 145 or the application 147 to communicate and exchange data with the kernel 141. Further, the middleware 143 may control (e.g., perform scheduling or load balancing) for task requests received from the application 147 by using, for example, a method of assigning a priority for use of the system resource (e.g., the bus 110, the processor 120, or the memory 130) of the electronic device 101 to the application 147.

The API 145 is an interface for allowing the applications 147 to control functions provided by the kernel 141 and the middleware 143. The API 145 may include at least one interface or function (e.g., instruction), such as, for example, a file control function, a window control function, an image processing function, or a text control function.

According to various embodiments, the application 147 may include a short message service (SMS)/multimedia messaging service (MMS) application, an e-mail application, a calendar application, an alarm application, a health care application (e.g., an application for measuring an amount of exercise or blood glucose level of a user), and/or an environmental information application (e.g., an application for providing atmospheric pressure information, humidity information, temperature information, or the like). It is noted that a user may be any person who uses the electronic device 101. Additionally or alternatively, the application 147 may include an application associated with information exchange between the electronic device 101 and an external electronic device (e.g., the external electronic devices 102, 104). An application associated with information exchange, for example, may include a notification relay application for transferring specific information to the external electronic devices 102, 104 or a device management application for managing the external electronic devices 102, 104.

The notification relay application may include a function for transferring notification information that is generated in another application of the electronic device 101 (e.g., the SMS/MMS application, the e-mail application, the health care application, or the environmental information application), to the external electronic devices 102, 104. Additionally or alternatively, the notification relay application may receive notification information from the external electronic devices 102, 104 and provide the received notification information to the user. The device management application may manage (e.g., install, remove, or update) a function for at least a part of the external electronic devices 102, 104 communicating with the electronic device 101 (e.g., a function of turning on/off an external electronic device itself (or some components thereof) or adjusting the brightness (or resolution) of a display), an application running on the external electronic device, or a service provided in the external electronic device (e.g., a calling or messaging service).

According to various embodiments, the application 147 may include an application specified according to an attribute (e.g., type) of the external electronic devices 102, 104. For example, when at least one of the external electronic devices 102, 104 is an MP3 player, the applications 147 may include an application associated with music playback. Similarly, when at least one of the external electronic devices 012, 104 is a mobile medical device, the applications 147 may include an application associated with health care. According to an embodiment, the applications 147 may include at least one of an application assigned to the electronic device 101 and an application received from a server 106 or the external electronic devices 102, 104.

The input/output interface 150, for example, may transfer instructions or data, input from the user through an input/output device associated with the input/output interface 150 (e.g., a sensor, a keyboard, or a touch screen), to the processor 120, the memory 130, or the communication interface 170 through the bus 110. For example, the input/output interface 150 may provide the processor 120 with data corresponding to the user's touch input through a touch screen. Further, the input/output interface 150 may, for example, receive instructions or data from the processor 120, the memory 130, or the communication interface 170, through the bus 110 and output the received instructions or data through the input/output device (e.g., a speaker or a display). For example, the input/output interface 150 may output voice data processed by the processor 120 to the user through a speaker.

The display 160 may display various pieces of information (e.g., multimedia data or text data) to the user. The communication interface 170 may establish communication between the electronic device 101 and the external electronic devices 102, 104 or the server 106. For example, the communication interface 170 may connect to the network 162 through a wireless or wired communication link and thereby communicate with the external device 104 and the server 106. The wireless communication associated with the network 162, for example, may include wireless fidelity (WiFi), Bluetooth (BT), a global positioning system (GPS), and/or cellular communication (e.g., long-term evolution (LTE), LTE-Advanced (LTE-A), code division multiple access (CDMA), universal mobile telecommunications system (UMTS), wireless broadband (WiBro), and/or global system for mobile communications (GSM). Examples of the wired communication associated with the network 162 may include a universal serial bus (USB), a high definition multimedia interface (HDMI), recommended standard 232 (RS-232), and/or a plain old telephone service (POTS). Additionally or alternatively, the network 162 may be a telecommunications network. The telecommunications network may include, for example, a computer network, the Internet, the Internet of things (IoT), and/or a telephone network. A protocol (e.g., a transport layer protocol, a data link layer protocol, or a physical layer protocol) for communication between the electronic device 101 and the external device 104 and the server 106 may be supported by the application 147, the application programming interface 145, the middleware 143, the kernel 141, and/or the communication interface 170.

FIG. 1B also illustrates a communications link 164 that may be separate from the communications link between the electronic device 101 and the network 162. In some embodiments, the communications link 164 may communicatively couple the electronic device 101 and the external electronic device 102. The communications link 164 may be a near field communication (NFC) link, which is a wireless technology allowing electronic devices 101 and 102 to communicate over a short distance of approximately 10 cm or less. In general, there are two modes for the NFC communications link 164, namely a passive communication mode and an active communication mode. In the passive communication mode, the initiator device provides a carrier field and the target device answers by modulating the existing field. In this mode, the target device may draw its operating power from the initiator-provided electromagnetic field, thus making the target device a transponder. In the active communication mode, both initiator and target device communicate by alternately generating their own fields. In this mode, one device deactivates its radiofrequency (RF) field while it is waiting for data from the other device. In this mode, both devices typically have power supplies. Devices configured to communicate over the NFC communications link 164 are able to receive and transmit data at the same time.

The NFC communications link 164 may be enabled by (e.g. mediated through) an antenna that is embedded in the electronic device 101. The antenna that enables the NFC communications link 164 may be an NFC antenna, which may be an inductive structure, e.g., similar to a transformer winding (in such an analogy, the NFC antenna of the target device may form one winding of a transformer winding pair, and the NFC antenna of the initiator device may form the other winding of the transformer pair). In other words, the antenna that enables the NFC communications link 164 relies on inductive coupling between the electronic device 101 and the external electronic device 102 for communication.

The NFC antenna may be designed to operate with signals having a frequency of about 13.56 MHz, i.e., a wavelength of approximately 22 meters, which means that a half-wave antenna for NFC would need to be approximately 11 meters in length, and a quarter-wave antenna for NFC would need to be approximately 5.5 meters in length. The NFC antenna may also be used for wireless power transfer for the electronic device 101. Since most NFC tags are designed to be extremely small, e.g., on the order of a few centimeters or less on a side, and flat in order to fit within small electronic devices, the NFC antenna of the electronic device 101 may need to be packaged into a volume that is orders of magnitude smaller in size than the dimensions of a classic dipole antenna that would be needed to operate in the frequency bands used for NFC.

Figure 2A:
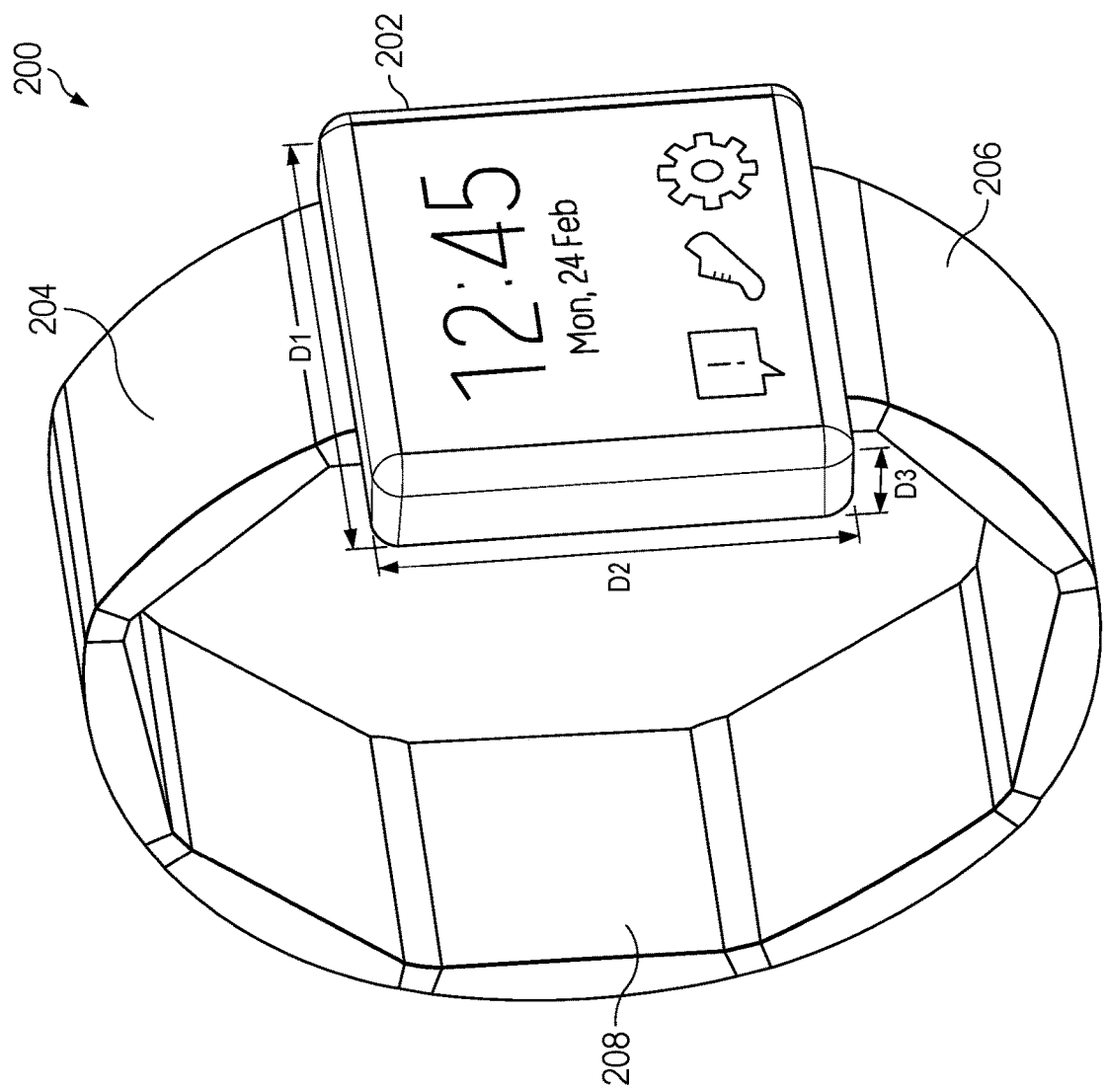
FIG. 2A shows an embodiment where the electronic device of FIGS. 1A and 1B is a smartwatch.

FIG. 2A shows an embodiment where the electronic device 101 of FIGS. 1A and 1B is a smartwatch 200. The smartwatch 200 includes a body 202, a first strap 204, and a second strap 206 for fixing the body 202 of the smartwatch 200 to a wrist of the user. The first strap 204 and the second strap 206 may fix the smartwatch 200 to the wrist of the user by various methods. For example, straps 204, 206 may be formed of a resilient material and may be mounted on or wrapped around the wrist of the user. The first strap 204 and the second strap 206 may include a fixing unit 208 (e.g. a clasp, hook, fastener, or the like) that may connect and fix the first strap 204 and the second strap 206 after the first strap 204 and the second strap 206 surround the wrist of the user. The straps 204, 206 may be manufactured by various methods known in the art. In some embodiments, at least a portion of the body 202 of the smartwatch 200 (e.g. an outer ring of the body 202) may be formed from a metal.

The smartwatch 200 may have a compact mechanical design. For example, the body 202 of the smartwatch 200 may have a first dimension D1 (e.g. a length), a second dimension D2 (e.g. a width), and a third dimension D3 (e.g. a thickness). In some embodiments, the first dimension D1, the second dimension D2, and the third dimension D3 may be orthogonal to each other. The first dimension D1 and the second dimension D2 may be less than 40 mm. The third dimension D3 may be less than 8 mm. As described above in reference to FIG. 1B, the smartwatch 200 may include bus 110, processor 120, memory 130, input/output interface 150, display 160, and communication interface 170. These features and functions of the smartwatch 200 may be implemented using a plurality of circuits, which have to fit within the compact body 202 of the smartwatch 300. As an example, antennas that allow for WiFi, BT, GPS, and/or cellular communication of the smartwatch 200 with the external electronic device 104 or the server 106 via the network 162 may need to be housed within the body 202 of the smartwatch 200. Furthermore, the NFC antenna that allows for the NFC communications link 164 between the smartwatch 200 and the external electronic device 102 may also need to be housed within the body 202 of the smartwatch 200. Additionally, a battery for the smartwatch 200 (for providing power to the circuits included in the body 202 of the smartwatch 200) may also be housed within the body 202 of the smartwatch 200.

Figure 2B:
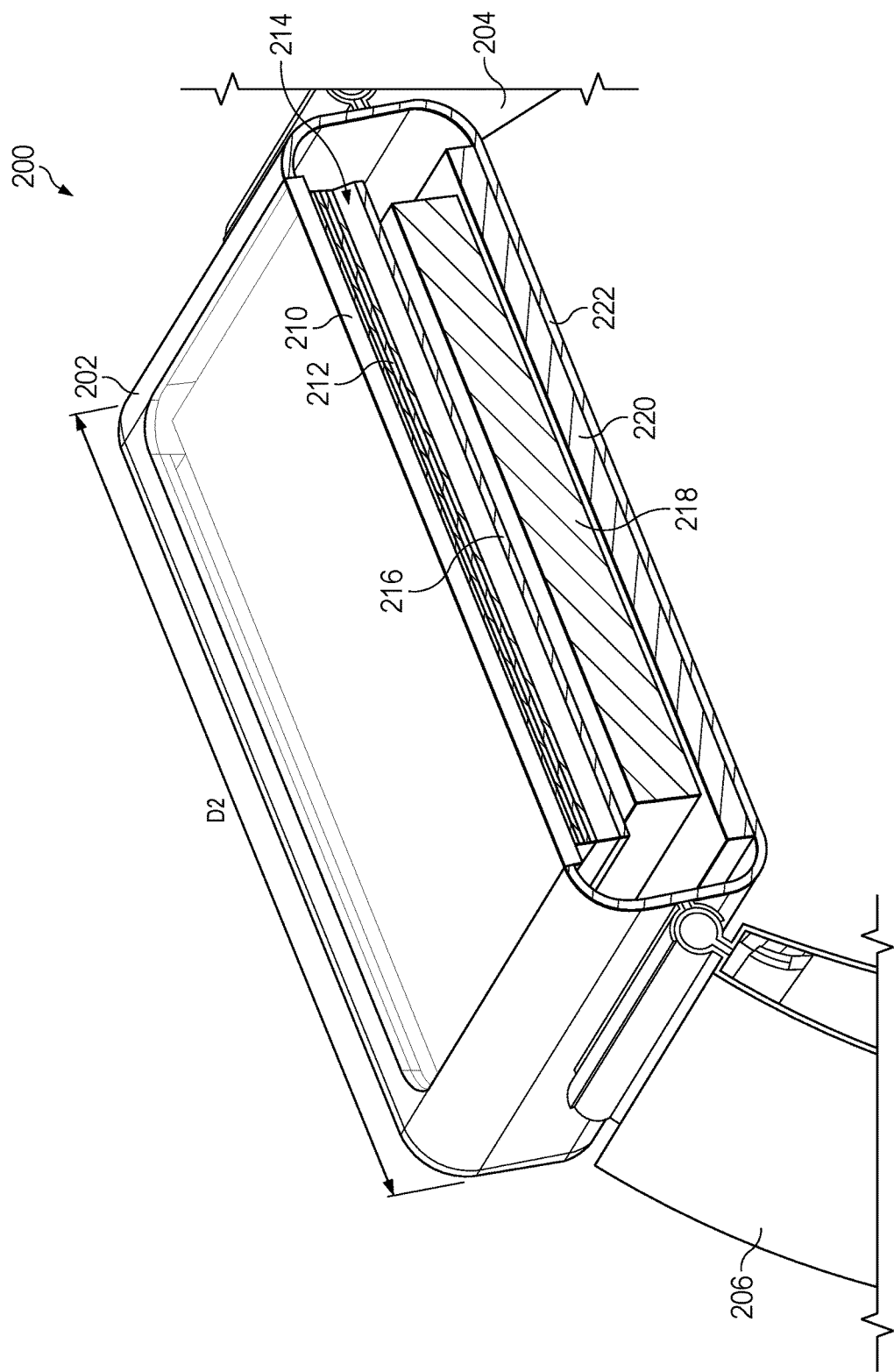
FIG. 2B shows a cross-sectional view of the body of the smartwatch shown in FIG. 2A, in accordance with an embodiment.

FIG. 2B shows a cross-sectional view of the body 202 of the smartwatch 200 shown in FIG. 2A, in accordance with an embodiment. The body 202 of the smartwatch 200 may secure a display 210 that presents information to the user. The display 210 may also be a surface of the smartwatch 200 that receives touch input from the user. The body 202 of the smartwatch 200 also houses a sensing grid 212 (e.g. a capacitive or resistive sensing grid) disposed below the display 210 and within the body 202 of the smartwatch 202. The sensing grid 212 may be configured to detect touch input received from the user. The display 210 and the sensing grid 212 may, in combination, form a touchscreen display of the smartwatch 200.

The body 202 of the smartwatch 200 may also enclose a first circuit board 214 that is electrically and/or communicatively coupled to the sensing grid 212. In the example shown in FIG. 2B, the first circuit board 214 is shown as being in physical contact with the sensing grid 212 for the sake of simplicity; however, in other embodiments, the first circuit board 214 and the sensing grid 212 may be separated by a non-zero distance. The first circuit board 214 may include a dielectric substrate (e.g. an FR-4 substrate) having a thickness less than about 0.5 mm and may include circuitry (e.g. processor, controller, etc.) that may be needed to detect, process, and interpret electrical signals that are generated by the sensing grid 212 in response to a touch input from the user.

The body 202 of the smartwatch 200 further houses a first ground plane 216, which may be a metal structure configured to function as a metal shielding for the first circuit board 214, the sensing grid 212, and the display 210. In the example shown in FIG. 2B, the first ground plane 216 is shown as being disposed below and in physical contact with the first circuit board 214 for the sake of simplicity; however, in other embodiments, the first ground plane 216 and the first circuit board 214 may be separated by a non-zero distance. In yet other embodiments, however, the first ground plane 216 and the first circuit board 214 may be laterally adjacent to each other (e.g. as in the example of FIGS. 4A-4B). The first ground plane 216 may shield the first circuit board 214, the sensing grid 212, and the display 210 from electromagnetic or RF interference that may be generated by other components disposed in the body 202 of the smartwatch 200. For example, the smartwatch 200 may include a battery 218 and a second circuit board 220. The second circuit board 220 may include one or more circuits or antennas necessary to provide the smartwatch 200 with the above-identified features and functions. In some embodiments, the second circuit board 220 may include a dielectric substrate (e.g. an FR-4 substrate) having a thickness less than about 0.5 mm. As described above, the smartwatch 200 may be capable of wireless charging (e.g. operating at a frequency of about 6.78 MHz), Bluetooth communication (e.g. operating at a frequency of 2.4-2.485 GHz), Wi-Fi connectivity (e.g. operating at a frequency of 2.401-2.495 GHz), GPS connectivity (e.g. operating at a frequency of 1.563-1.587 GHz) and/or cellular communication (e.g. operating at a frequency of 880-960 MHz). The various circuits and antennas necessary for these capabilities may be disposed or formed on the second circuit board 220, and the first ground plane 216 may shield the first circuit board 214, the sensing grid 212, and the display 210 from electromagnetic or RF interference that may be generated by the circuits and antennas of the second circuit board 220.

The example of FIG. 2B also shows that the smartwatch 200 includes an underside 222, which may be formed of a metal or polycarbonate material. The underside 222 may act as a second ground plane that shields the battery 218 and the second circuit board 220 from electromagnetic or RF interference that may be generated by devices external to the smartwatch 200. Although the first circuit board 214 and the first ground plane 216 are shown as being planar across the entirety of the second dimension D2 of the body 202 of the smartwatch 200, it is noted that the first ground plane 216 may be a non-planar surface. Additionally, the first circuit board 214 may not extend across an entirety of the second dimension D2 of the body 202 of the smartwatch 200. This may be due, at least in part, to various obstruction zones created by components compactly housed in the body 202 of the smartwatch 200. For instance, the thickness and size of the battery 218 and the presence of various disposed on the second circuit board 220 components (e.g. the various antennas for Bluetooth communication, Wi-Fi connectivity, GPS connectivity, and/or cellular communication) may obstruct portions of the first ground plane 216 and the first circuit board 214, thereby preventing the first ground plane 216 or the first circuit board 214 from being planar across the entirety of the second dimension D2 of the body 202. Stated differently, in a compact smartwatch design, the first ground plane 216 may not be fully flat, and instead, the smartwatch 200 may have obstruction zones within its body 202 due to the insertion of multiple antennas (e.g. for Bluetooth, Wi-Fi, GPS) within the body 202 of the smartwatch 200.

The obstruction zones and the cramped real estate within the body 202 of the smartwatch 200 may reduce the amount of room available for the NFC antenna. This reduction in the amount of room available may prevent the use of a classical multi-turn inductive coil antenna or a continuous single-turn inductive coil antenna for the NFC antenna. Consequently, it may be desirable to form an NFC antenna, within the body 202 of the smartwatch 200, having high RF efficiency even when obstruction zones and cramped real estate within the body 202 of the smartwatch 200 reduce the amount of room available for the NFC antenna.

According to various embodiments disclosed herein, the NFC antenna is realized by a discontinuous antenna (e.g. discontinuous single-turn antenna) having a first trace and a second trace physically separated from the first trace and where electrical continuity between the first trace and the second trace is mediated through at least a part of the first ground plane 216. In other words, the first ground plane 216 functions as a portion of the NFC antenna, thereby circumventing the issue of obstruction zones and cramped real estate within the body 202 of the smartwatch 200. The proposed design of the NFC antenna is easily realized by simple mechanical milling or etching (e.g. laser or chemical etching) of the first circuit board 214. Other embodiments disclosed herein also contemplate using the underside 222 (e.g. the second ground plane) or the body 202 (e.g. a metal portion of the body 202) of the smartwatch 200 as the structure that mediates the electrical continuity between the first trace and the second trace of the NFC antenna.

Figure 3A:
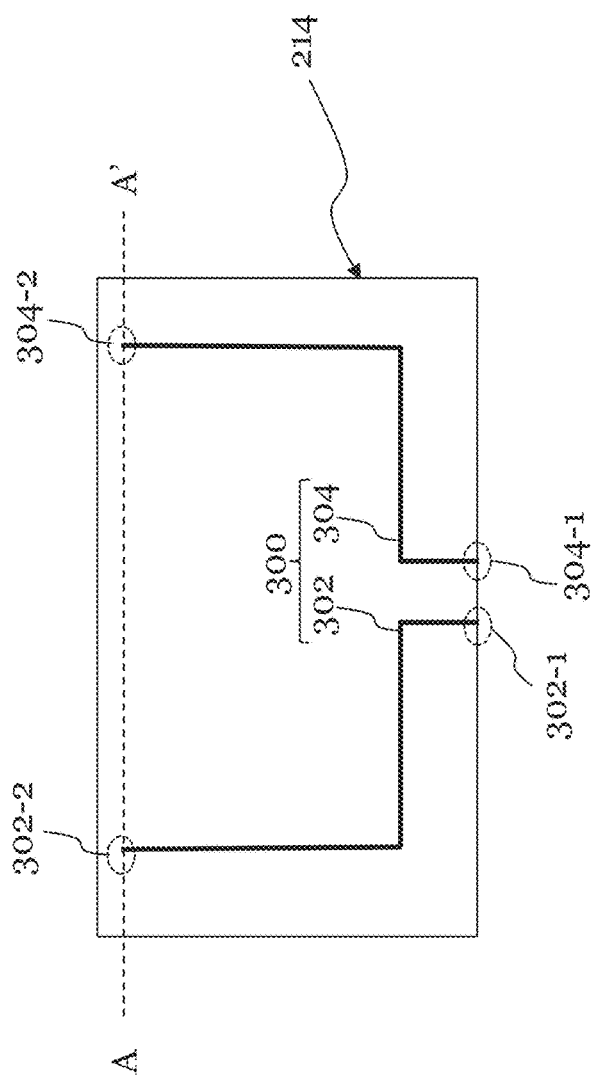
FIGS. 3A, 6A, and 7A show top-down views of circuit boards having a first trace and a second trace of an NFC antenna, in accordance with various embodiments.

FIG. 3A shows a top-down view of the first circuit board 214 having a first trace 302 and a second trace 304 of an NFC antenna 300, in accordance with an embodiment. The shapes of the first trace 302 and the second trace 304 of the NFC antenna 300 in FIG. 3A are merely exemplary and other shapes of the first trace 302 and the second trace 304 may be possible in other embodiments. As shown in FIG. 3A, the NFC antenna 300 includes a first trace 302 having a first end 302-1 and a second end 302-2. The NFC antenna 300 further includes a second trace 304 that is physically separated from the first trace 302. The second trace 304 may also include a first end 304-1 and a second end 304-2. The first trace 302 and the second trace 304 may be formed of electrically conductive material (copper, tungsten, or the like) on the first circuit board 214 using methods known in the art (e.g. milling or etching, such as laser or chemical etching). The first end 302-1 of the first trace 302 and the first end 304-1 of the second trace 304 may form RF inputs (e.g. differential RF inputs or driving nodes) of the NFC antenna 300. The second end 302-2 of the first trace 302 and the second end 304-2 of the second trace 304 may form RF outputs of the first trace 302 and the second trace 304, respectively.

Figure 3B:
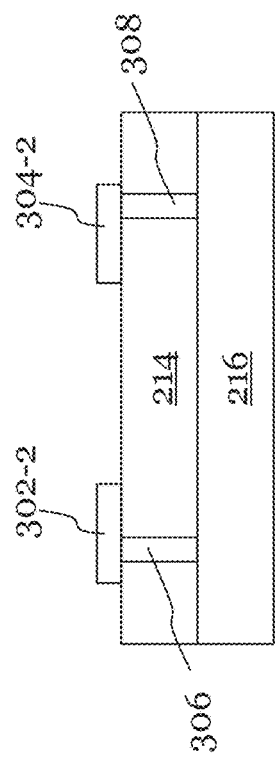
FIGS. 3B, 6B, and 7B show cross-sectional views of the circuit boards shown in FIGS. 3A, 6A, and 7A, respectively, in accordance with various embodiment.

FIG. 3B shows a cross-sectional view of the first circuit board 214 and the NFC antenna 300 shown in FIG. 3A, in accordance with an embodiment. The cross-sectional view shown in FIG. 3B may be taken along the line A-A' in FIG. 3A. As shown in FIG. 3B, the first circuit board 214 may be disposed over the first ground plane 216, such as in the embodiment depicted in FIG. 2B. As shown in FIG. 3A, the first trace 302 and the second trace 304 of the NFC antenna 300 are physically separated from each other. However, electrical continuity between the first trace 302 and the second trace 304 is provided through the first ground plane 216. For example, as shown in FIG. 3B, a first conductive via 306 may extend through the dielectric material of the first circuit board 214 to electrically couple the second end 302-2 of the first trace 302 to the first ground plane 216. Similarly, a second conductive via 308 may extend through the dielectric material of the first circuit board 214 to electrically couple the second end 304-2 of the second trace 304 to the first ground plane 216, thereby electrically coupling the first trace 302 and the second trace 304 to each other to form the NFC antenna 300. The first trace 302 and the second trace 304 are discontinuous portions of the NFC antenna 300; however, electrical continuity between the physical discontinuities 302, 304 of the NFC antenna 300 is provided by the first ground plane 216 to form a single-turn antenna (e.g. a single-turn differential antenna). In other words, the first ground plane 216 may act as a large trace, allowing current to flow through the first ground plane 216, thus creating electrical continuity between the physical discontinuities 302, 304 of the NFC antenna 300. Stated differently, RF outputs 302-2, 304-2 of the first trace 302 and the second trace 304 are connected to first ground plane 216 such that the first ground plane 216 completes a loop and forms a single-turn antenna loop that includes the first trace 302, the second trace 304, and the first ground plane 216. As seen in the embodiments of FIGS. 3A-3B, the first ground plane 216 functions as a portion of the NFC antenna 300, thereby circumventing the issue of obstruction zones and cramped real estate within the body 202 of the smartwatch 200. The proposed design of the NFC antenna 300 is also easily realized by simple mechanical milling or etching (e.g. laser or chemical etching) of the first circuit board 214. The embodiments illustrated in FIGS. 3A-3B show the first ground plane 216 being disposed below the first circuit board 214 (e.g. such that the traces 302 and 304 are arranged between the sensing grid 212 and the first ground plane 216. However, as mentioned above, the first ground plane 216 and the first circuit board 214 may be laterally adjacent to each other, and such an embodiment is illustrated in FIGS. 4A-4B.

Figure 4A:
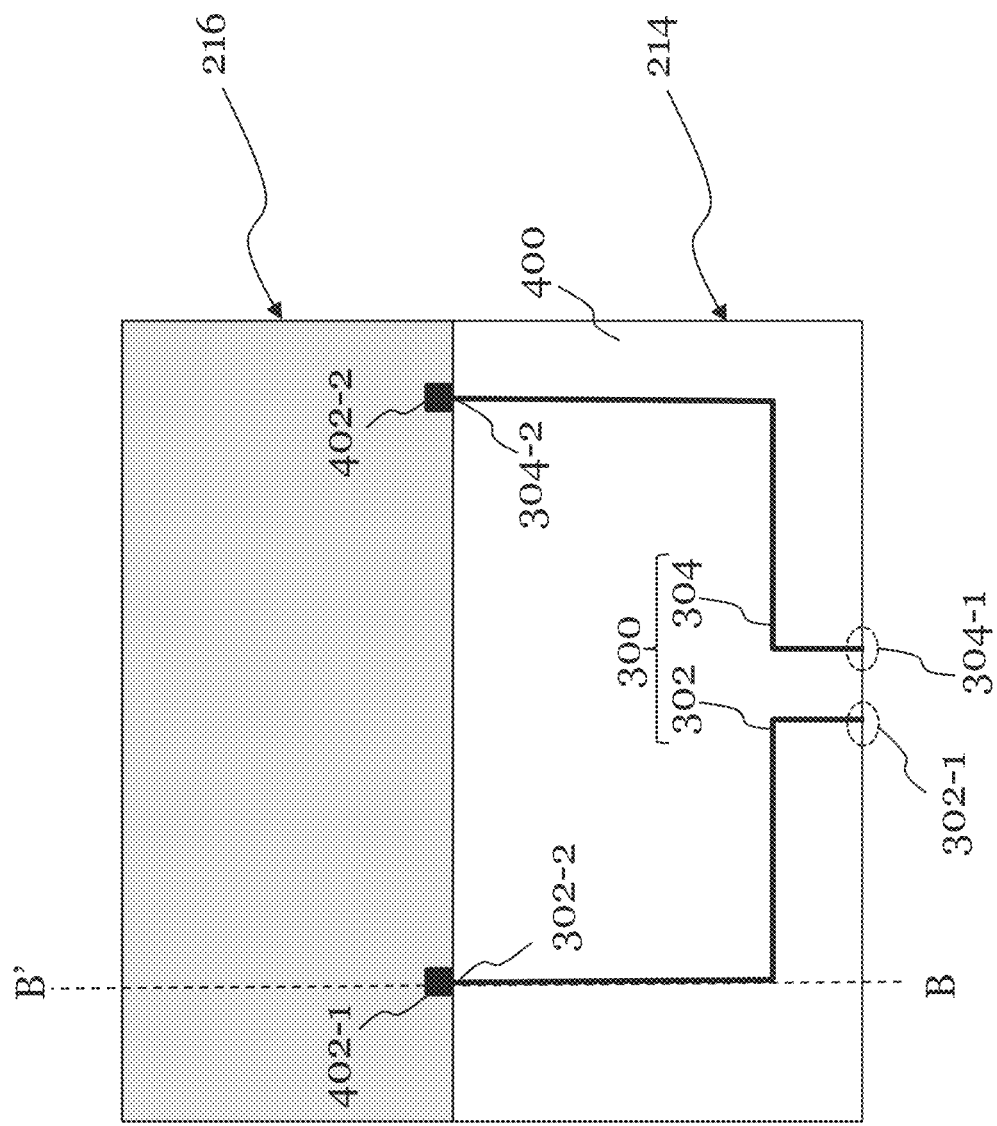
FIG. 4A shows a top-down view of a first circuit board, having a first trace and a second trace of an NFC antenna, laterally adjacent to a first ground plane, in accordance with an embodiment.

FIG. 4A shows a top-down view of an embodiment where the first circuit board 214, having the first trace 302 and the second trace 304 of the NFC antenna 300, is laterally adjacent to the first ground plane 216. FIG. 4B shows a cross-sectional view of the first circuit board 214 and the first ground plane 216 shown in FIG. 4A, in accordance with an embodiment. Similar to the embodiments of FIGS. 3A-3B, the first trace 302 and the second trace 304 shown in FIGS. 4A-4B are physical discontinuities of the NFC antenna 300; however, electrical continuity between the physical discontinuities 302, 304 is provided by the first ground plane 216 to form a discontinuous single-turn antenna (e.g. a discontinuous single-turn differential antenna). In other words, current flowing through the first ground plane 216 creates electrical continuity between the physical discontinuities 302, 304 of the NFC antenna 300. The difference between the embodiment of FIGS. 4A-4B and the embodiment of FIGS. 3A-3B, however, is that the first ground plane 216 is laterally adjacent to the first circuit board 214. In order to ensure that the first trace 302 and the second trace 304 function as an antenna, electro-magnetic isolation between ground plane 216 and each of the first trace 302 and the second trace 304 is needed. This may be accomplished by the inclusion of a ferrite plane 400 disposed beneath the first trace 302 and the second trace 304. In some embodiments, the ferrite plane 400 may be disposed over the first circuit board 214. In other embodiments, the ferrite plane 400 may be integrated into a portion of the first circuit board 214 (e.g. the portion of the first circuit board 214 over which the first trace 302 and the second trace 304 are disposed). The ferrite plane 400 electromagnetically isolates the first trace 302 and the second trace 304 from the ground plane 216. It is noted that while the ferrite plane 400 is included in the embodiments illustrated in FIGS. 4A-4B, such a ferrite plane may also be present in the embodiments of FIGS. 3A-3B and in the embodiments of FIGS. 6A, 6B, 7A, and 7B (described below). In such cases, the ferrite plane is disposed beneath the first trace 302 and the second trace 304 in order to electromagnetically isolate the first trace 302 and the second trace 304 from the structure within the smartwatch 200 that is functioning as the ground plane. As such, electrical connectivity between the second end 302-2 of the first trace 302 and the first ground plane 216 may be made through a first electrical connector 402-1, which may, as an example, be solder. Similarly, electrical connectivity between the second end 304-2 of the second trace 304 and the first ground plane 216 may be made through a second electrical connector 402-2, which may, as an example, be solder. Consequently, electrical continuity between the physical discontinuities 302, 304 of the NFC antenna 300 is provided by the first ground plane 216 to form a single-turn antenna (e.g. a single-turn differential antenna). In other words, the first ground plane 216 may act as a large trace, allowing current to flow through the first ground plane 216, thus creating electrical continuity between the physical discontinuities 302, 304 of the NFC antenna 300.

Figure 4B:
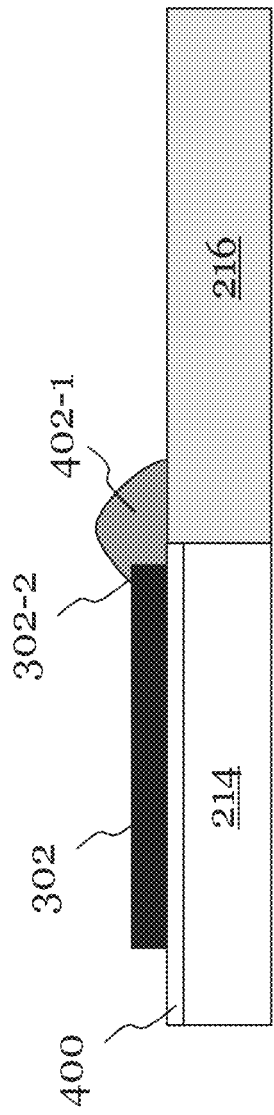
FIG. 4B shows a cross-sectional view of the first circuit board and the first ground plane shown in FIG. 4A, in accordance with an embodiment.
Figure 5:
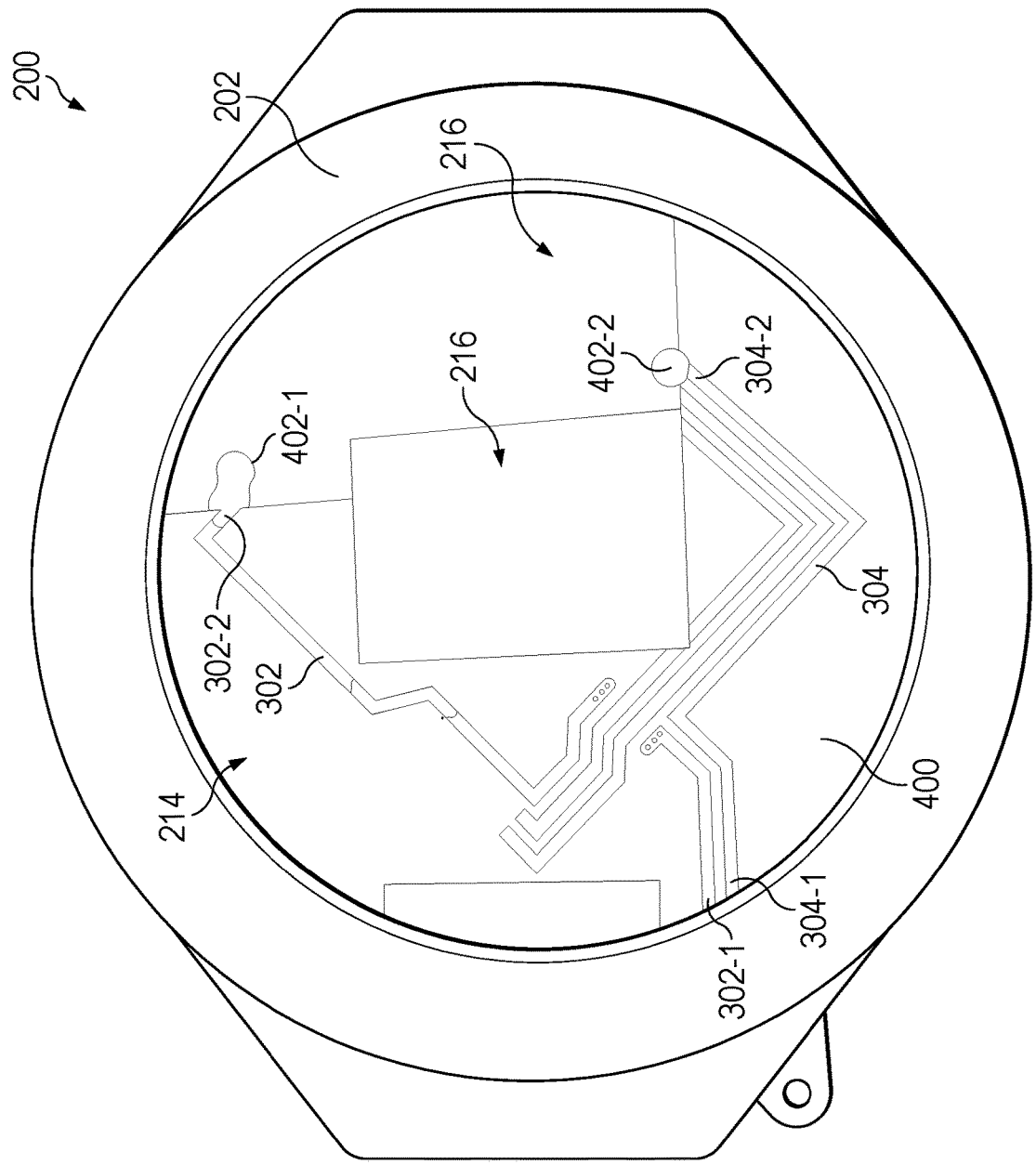
FIG. 5 shows an actual implementation of a smartwatch in accordance with the embodiment shown in FIGS. 4A-4B.

FIG. 5 shows an actual implementation of a smartwatch 200 in accordance with the embodiment shown in FIGS. 4A-4B. As shown in FIG. 5, the smartwatch 200 includes the body 202 that houses the first circuit board 214 that is laterally adjacent to the first ground plane 216. The first circuit board 214 includes the first trace 302 having the first end 302-1 and the second end 302-2. The first circuit board 214 also includes the second trace 304 having the first end 304-1 and the second end 304-2. Each of the first trace 302 and the second trace 304 run across the ferrite plane 400. The second end 302-2 of the first trace 302 is electrically coupled to the first ground plane 216 by the first electrical connector 402-1, while the second end 304-2 of the second trace 304 is electrically coupled to the first ground plane 216 by the second electrical connector 402-2. Electrical continuity between the physical discontinuities 302, 304 of the NFC antenna 300 is provided by the first ground plane 216 to form a single-turn antenna (e.g. a single-turn differential antenna); the first ground plane 216 may act as a large trace, allowing current to flow through the first ground plane 216, thus creating electrical continuity between the physical discontinuities 302, 304 of the NFC antenna 300.

Figure 6A:
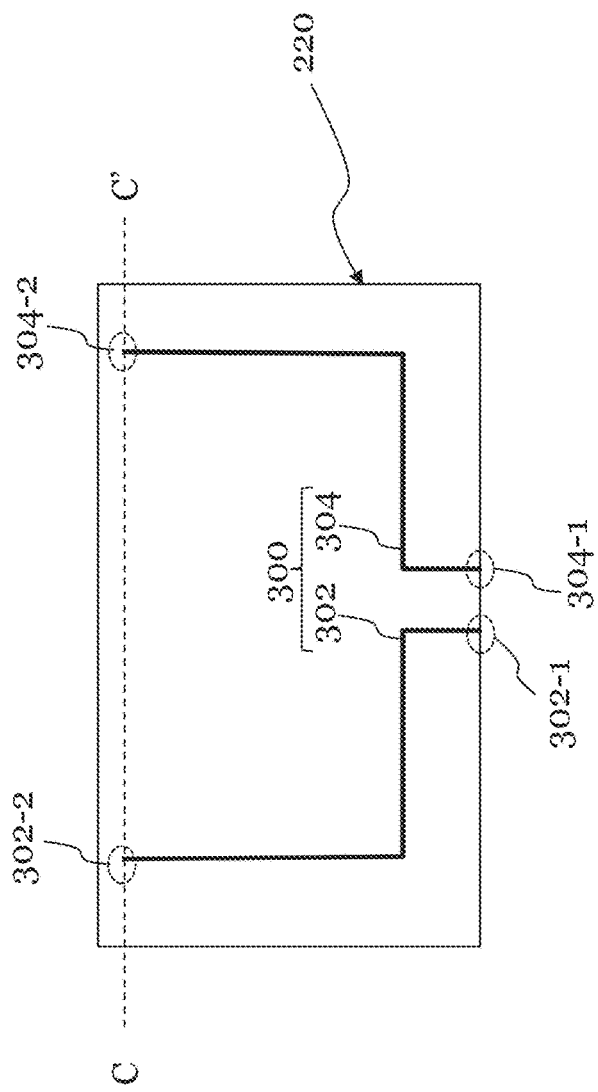
Figure 6B:
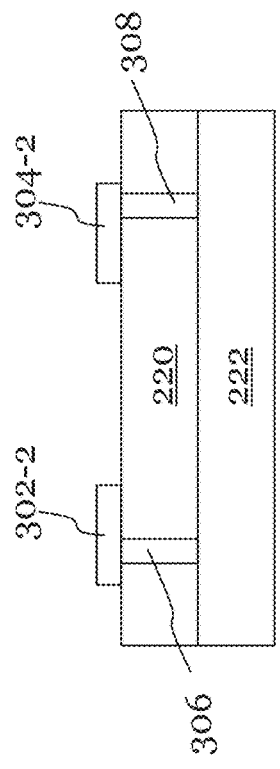

Other embodiments contemplate using the underside 222 (e.g. the second ground plane) of the smartwatch 200 as the structure that mediates the electrical continuity between the first trace 302 and the second trace 304 of the NFC antenna 300. In such embodiments, the first trace 302 and the second trace 304 of the NFC antenna 300 may be milled or etched on the second circuit board 220, as shown in FIGS. 6A-6B. It is noted that the cross-sectional view shown in FIG. 6B may be taken along the line C-C' in FIG. 6A. The first conductive via 306 may extend through the dielectric material of the second circuit board 220 to electrically couple the second end 302-2 of the first trace 302 to the underside 222 of the smartwatch 200, which may function as a main system ground plane. Similarly, the second conductive via 308 may extend through the dielectric material of the second circuit board 220 to electrically couple the second end 304-2 of the second trace 304 to the underside 222 of the smartwatch 200, thereby electrically coupling the first trace 302 and the second trace 304 to each other to form the single-loop NFC antenna 300.

Figure 7A:
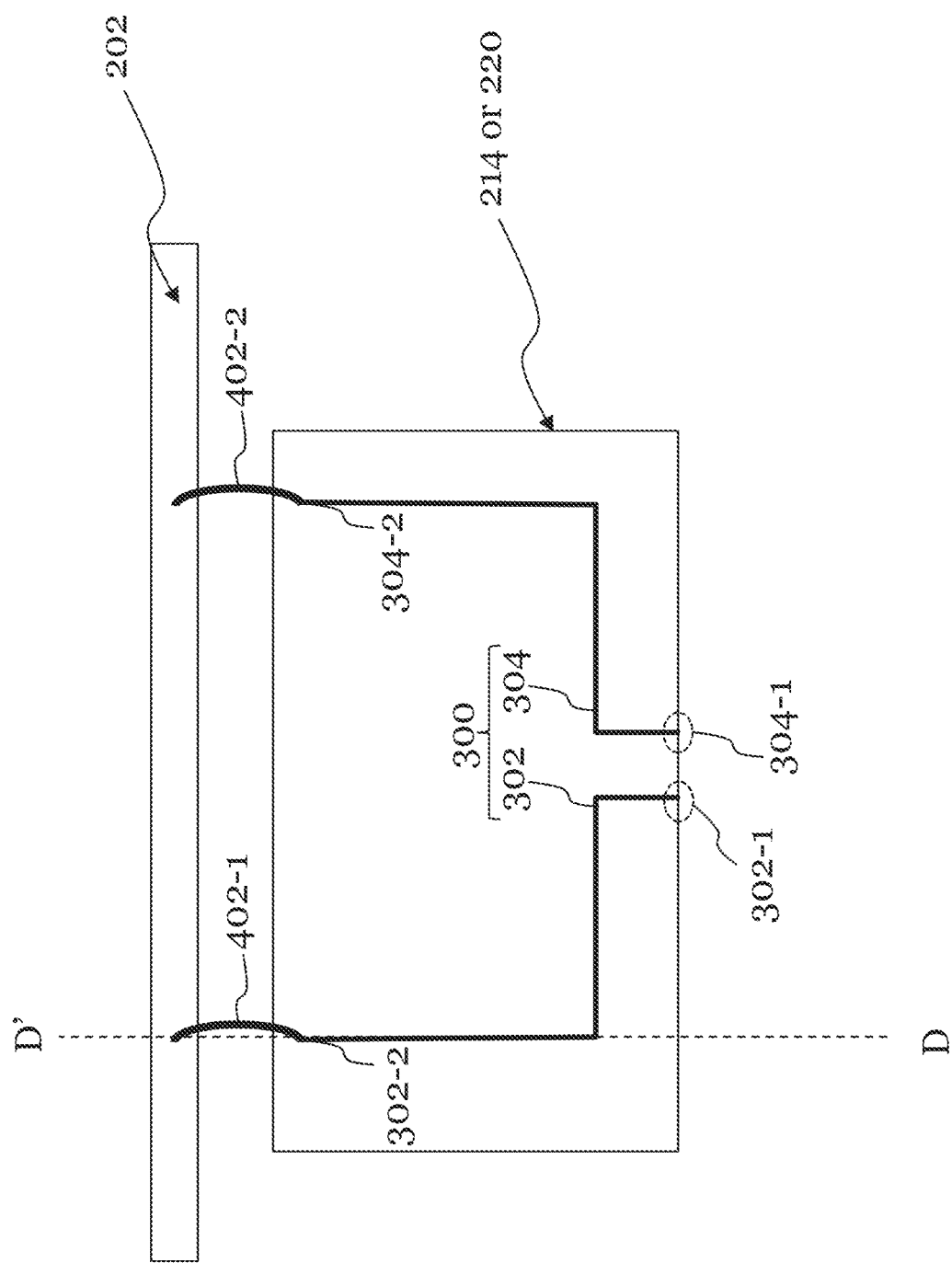
Figure 7B:
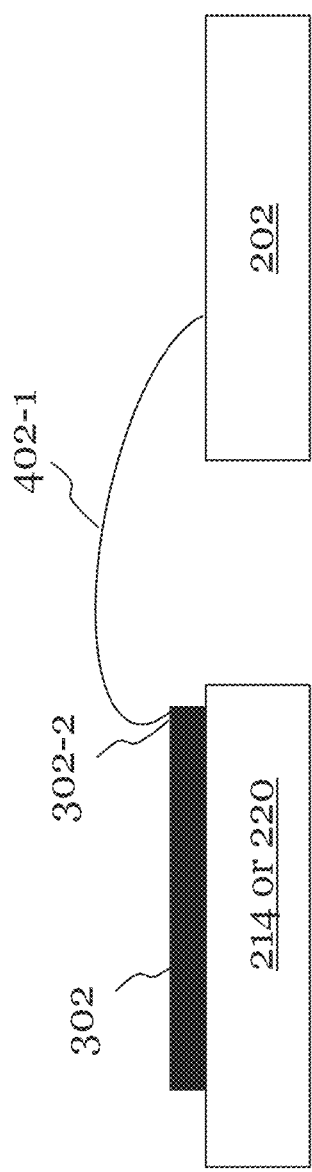

Further embodiments contemplate using the body 202 of the smartwatch 200 (e.g. portions of the body 202 that are formed from a metal) as the structure that mediates the electrical continuity between the first trace 302 and the second trace 304 of the NFC antenna 300. In such embodiments, the body 202 of the smartwatch 200 may function as a ground plane and the first trace 302 and the second trace 304 of the NFC antenna 300 may be milled or etched on the first circuit board 214 or the second circuit board 220 and be electrically coupled to the body 202 of the smartwatch 200 by the first electrical connector 402-1 and the second electrical connector 402-2, which may, as an example, be wire bonds, as shown in FIGS. 7A-7B. It is noted that the cross-sectional view shown in FIG. 7B may be taken along the line D-D' in FIG. 7A. In the embodiment shown in FIGS. 7A-7B, the body 202 of the smartwatch 200 is laterally adjacent to the first circuit board 214 or the second circuit board 220. As such, electrical connectivity between the second end 302-2 of the first trace 302 and the body 202 may be made through a first electrical connector 402-1, which may, as an example, be a wire bond. Similarly, electrical connectivity between the second end 304-2 of the second trace 304 and the body 202 may be made through a second electrical connector 402-2, which may, as an example, be a wire bond. Consequently, electrical continuity between the physical discontinuities 302, 304 of the NFC antenna 300 is provided by the body 202 of the smartwatch 200 to form a single-turn antenna (e.g. a single-turn differential antenna). In other words, the body 202 of the smartwatch 200 may act as a large trace, allowing current to flow through the body 202, thus creating electrical continuity between the physical discontinuities 302, 304 of the NFC antenna 300.

In summary, obstruction zones and the cramped real estate within the body 202 of the smartwatch 200 may reduce the amount of room available for the NFC antenna 300. This reduction in the amount of room available may prevent the use of a classical multi-turn inductive coil antenna or a continuous single-turn inductive coil antenna for the NFC antenna 300. According to various embodiments disclosed herein, the NFC antenna 300 is realized by a discontinuous antenna (e.g. discontinuous single-turn antenna) having a first trace 302 and a second trace 304 physically separated from the first trace 302 and where electrical continuity between the first trace 302 and the second trace 304 is mediated through an intermediary structure, which can be the first ground plane 216, the underside 222 of the smartwatch 200, or the body 202 of the smartwatch. Since a size of the NFC antenna 300 formed by the first trace 302, the second trace 304, and the intermediary structure is not limited by the obstruction zones and cramped real estate within the body 202 of the smartwatch 200, the NFC antenna 300 formed by the embodiments disclosed herein have high RF efficiency compared to NFC antennas that are made to confirm to the reduced amount of room available in the body 202 of the smartwatch 200. Furthermore, the embodiments disclosed herein allow the NFC antenna 300 to be compatible with the first ground plane 216 and the underside 222 of the smartwatch 200 (which may function as a main system ground plane), thereby avoiding the need for an opening in the first ground plane 216 and the underside 222 of the smartwatch 200 to ensure proper functioning of the NFC antenna 300.

An embodiment electronic device includes a ground plane; and an antenna. The antenna includes a first trace having a first end and a second end, the second end of the first trace being electrically coupled to the ground plane. The antenna also includes a second trace distinct and physically separated from the first trace, the second trace having a first end and a second end, the second end of the second trace being electrically coupled to the ground plane, the first trace and the second trace forming discontinuous portions of the antenna.

An embodiment electronic device includes a discontinuous single-turn antenna. The discontinuous single-turn antenna includes a first conductive trace having a first end and a second end; and a second conductive trace physically separated from the first conductive trace, the second conductive trace having a first end and a second end, where the first end of the first conductive trace and the first end of the second conductive trace include driving nodes of the discontinuous single-turn antenna. The electronic device further includes a ground plane electrically coupled to the second end of the first conductive trace and the second end of the second conductive trace, the ground plane being configured to provide electrical continuity between the first conductive trace and the second conductive trace.

An embodiment electronic device includes a metal shielding configured to shield internal circuitry of the electronic device from radiofrequency (RF) interference; a circuit board having a major surface; and an antenna. The antenna includes a first conductive line disposed on the major surface of the circuit board, the first conductive line having a first end and a second end, the first end of the first conductive line being configured to be a first RF input of the antenna. The antenna further includes a second conductive line disposed on the major surface of the circuit board, the second conductive line being physically separated from the first conductive line, the second conductive line having a first end and a second end, the first end of the second conductive line being configured to be a second RF input of the antenna, where electrical continuity between the first conductive line and the second conductive line is mediated through the metal shielding.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic device, comprising:
   a body of the electronic device comprising a housing;
   a ground plane disposed inside the housing and being separate from the housing; and
   an antenna, comprising:
     a first trace having a first end and a second end, the second end of the first trace being electrically coupled to the ground plane;
     a second trace distinct and physically separated from the first trace, the second trace having a first end and a second end, the second end of the second trace being electrically coupled to the ground plane, the first trace and the second trace defining discontinuous portions of the antenna;
   a first circuit board having the first trace and the second trace formed thereon, the first circuit board being housed within the body of the electronic device, wherein the first circuit board is laterally adjacent to the ground plane;
   a first electrical connector electrically coupling the second end of the first trace to the ground plane; and
   a second electrical connector electrically coupling the second end of the second trace to the ground plane.

2. The electronic device of claim 1, wherein the antenna comprises a single-turn antenna formed by the first trace, the second trace, and the ground plane.

3. The electronic device of claim 1, further comprising:
   a display secured by the body of the electronic device.

4. The electronic device of claim 3, wherein the first circuit board is disposed between the display and the ground plane, and wherein the first circuit board comprises the first electrical connector and the second electrical connector, the first electrical connector comprising a first conductive via extending through a dielectric material of the first circuit board, the first conductive via electrically coupling the second end of the first trace to the ground plane, and the second electrical connector comprising a second conductive via extending through the dielectric material of the first circuit board, the second conductive via electrically coupling the second end of the second trace to the ground plane.

5. An electronic device, comprising:
a touchscreen display;
a discontinuous single-turn antenna, comprising:
   a first conductive trace having a first end and a second end, and
   a second conductive trace physically separated from the first conductive trace, the second conductive trace having a first end and a second end, wherein the first end of the first conductive trace and the first end of the second conductive trace comprise driving nodes of the discontinuous single-turn antenna;
a first circuit board having the first conductive trace and the second conductive trace formed thereon; and
a second circuit board having further antennas of the electronic device formed thereon, the further antennas being configured to operate at frequencies different from the discontinuous single-turn antenna; and
a ground plane electrically coupled to the second end of the first conductive trace and the second end of the second conductive trace, the ground plane being configured to provide electrical continuity between the first conductive trace and the second conductive trace, the ground plane being housed within a body of the electronic device and further configured to shield the touchscreen display from radiofrequency (RF) interference generated by the further antennas of the second circuit board.

6. The electronic device of claim 5, wherein the first circuit board is disposed between the touchscreen display and the ground plane, and wherein the second circuit board is disposed between the ground plane and a backside of the electronic device.

7. The electronic device of claim 6, wherein the second end of the first conductive trace and the second end of the second conductive trace are coupled to the ground plane by conductive vias extending through a thickness of the first circuit board.

8. The electronic device of claim 5, wherein the ground plane comprises a non-planar surface, and wherein the first circuit board is disposed laterally adjacent to the ground plane and between the touchscreen display and the second circuit board.

9. The electronic device of claim 5, wherein the discontinuous single-turn antenna is configured to operate at a frequency of 13.56 MHz.

10. The electronic device of claim 5, wherein the discontinuous single-turn antenna is configured to provide at least one of radio communication or wireless power transfer to the electronic device.

11. The electronic device of claim 5, wherein the ground plane comprises a body or an underside of the electronic device.

12. The electronic device of claim 5, wherein the electronic device comprises a smartwatch.

13. An electronic device, comprising:
a metal shielding configured to shield internal circuitry of the electronic device from radiofrequency (RF) interference;
a circuit board having a major surface; and
an antenna, comprising:
   a first trace disposed on the major surface of the circuit board, the first trace having a first end and a second end, the first end of the first trace being configured to be a first RF input of the antenna; and
   a second trace disposed on the major surface of the circuit board, the second trace being physically separated from the first trace, the second trace having a first end and a second end, the first end of the second trace being configured to be a second RF input of the antenna, wherein electrical continuity between the first trace and the second trace is mediated through the metal shielding, wherein the metal shielding is disposed below the circuit board, and wherein the second end of the first trace and the second end of the second trace are electrically coupled to the metal shielding by conductive vias extending through a thickness of the circuit board and contacting a major surface of the metal shielding.

14. The electronic device of claim 13, wherein the second end of the first trace and the second end of the second trace being RF outputs of the first trace and the second trace, respectively.

15. The electronic device of claim 13, further comprising:
a ferrite plane disposed between the first trace and the metal shielding and between the second trace and the metal shielding.

16. The electronic device of claim 13, further comprising:
a touchscreen display; and
a further circuit board having further antennas of the electronic device formed thereon, the further antennas being configured to operate at frequencies different from the antenna, the metal shielding being further configured to shield the touchscreen display from radiofrequency (RF) interference generated by the further antennas of the further circuit board.

17. An electronic device, comprising:
a metal shielding configured to shield internal circuitry of the electronic device from radiofrequency (RF) interference;
a first circuit board having a major surface; and
an antenna, comprising:
   a first trace disposed on the major surface of the first circuit board, the first trace having a first end and a second end, the first end of the first trace being configured to be a first RF input of the antenna; and
   a second trace disposed on the major surface of the first circuit board, the second trace being physically separated from the first trace, the second trace having a first end and a second end, the first end of the second trace being configured to be a second RF input of the antenna, wherein electrical continuity between the first trace and the second trace is mediated through the metal shielding, wherein the metal shielding is laterally adjacent to the first circuit board, and wherein the second end of the first trace and the second end of the second trace are electrically coupled to the metal shielding by conductive structures disposed over the major surface of the first circuit board and a major surface of the metal shielding.

18. The electronic device of claim 17, further comprising:
a ferrite plane disposed between the first trace and the metal shielding and between the second trace and the metal shielding.

19. The electronic device of claim 17, further comprising:
a touchscreen display; and
a second circuit board having further antennas of the electronic device formed thereon, the further antennas being configured to operate at frequencies different from the antenna, the metal shielding being further configured to shield the touchscreen display from radiofrequency (RF) interference generated by the further antennas of the second circuit board.

* * * * *